(12) United States Patent
Chan

(10) Patent No.: US 6,713,398 B2
(45) Date of Patent: Mar. 30, 2004

(54) METHOD OF PLANARIZING POLYSILLICON PLUG

(75) Inventor: Bor-Wen Chan, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 300 days.

(21) Appl. No.: 09/440,904

(22) Filed: Nov. 16, 1999

(65) Prior Publication Data

US 2002/0068460 A1 Jun. 6, 2002

(30) Foreign Application Priority Data

Oct. 18, 1999 (TW) .......................................... 88117961 A

(51) Int. Cl.[7] .......................................... H01L 21/302
(52) U.S. Cl. .......................................... 438/697; 438/700
(58) Field of Search .......................... 438/712, 697, 438/700, 710, 733

(56) References Cited

U.S. PATENT DOCUMENTS

| | | | | |
|---|---|---|---|---|
| 3,865,792 A | * | 2/1975 | Lee .......................... | 528/341 |
| 4,515,652 A | * | 5/1985 | Gimpelson et al. .......... | 438/697 |
| 4,997,790 A | * | 3/1991 | Woo et al. ................... | 437/195 |
| 5,422,289 A | * | 6/1995 | Pierce ........................ | 437/32 |
| 5,550,076 A | * | 8/1996 | Chen .......................... | 437/52 |
| 5,578,523 A | * | 11/1996 | Fiordalice et al. .......... | 437/190 |
| 5,677,221 A | * | 10/1997 | Tseng ......................... | 437/52 |
| 5,756,400 A | * | 5/1998 | Ye et al. ..................... | 438/710 |
| 5,773,314 A | * | 6/1998 | Jiang et al. ................... | 438/3 |

OTHER PUBLICATIONS

Wolf, S. and Tauber, R.N., "Silicon Processing for the VLSI Era", vol. 1, p. 539.*

* cited by examiner

Primary Examiner—Kin-Chan Chen
(74) Attorney, Agent, or Firm—J.C. Patents

(57) ABSTRACT

A method of planarizing a polysilicon plug. A dielectric layer has an opening therein. Polysilicon is deposited into the opening to form a polysilicon layer so that the opening is completely filled and the top surface of the dielectric layer is covered. A high molecular weight compound is deposited to form a sacrificial film over the polysilicon layer. An anisotropic etching of the sacrificial film and the polysilicon layer is carried out to remove the sacrificial film and the polysilicon layer outside the opening.

13 Claims, 2 Drawing Sheets

METHOD OF PLANARIZING POLYSILLICON PLUG

CROSS-REFERENCE TO RELATED APPLICATION

This application claims the priority benefit of Taiwan application serial no. 88117961, filed Oct. 18, 1999.

BACKGROUND OF THE INVENTION

1. Field of the Invention

The present invention relates to a method of manufacturing integrated circuits. More particularly, the present invention relates to a method of planarizing a polysilicon plug by etching.

2. Description of the Related Art

As the level of integration of integrated circuit increases, sufficient surface area may not be available to accommodate all necessary interconnects. Hence, two or more metallic layers are usually formed. Functionally powerful products such as a microprocessor may even have four or five layers of metallic layers over a silicon chip.

In general, the fabrication of multi-level interconnects starts after MOS transistors are formed. Hence, multi-level interconnect fabrication can be regarded as an independent semiconductor process. To prevent the short-circuiting of the metal lines in a first metallic layer and the metal lines in a second metallic layer, metallic layers are isolated from each other by a dielectric layer. The dielectric layer is often referred to as an inter-metal dielectric layer.

FIGS. 1A and 1B are schematic cross-sectional views showing the process of planarizing a conventional polysilicon plug. A first metal line 101, a plug 104 (not completely formed yet) and an inter-metal dielectric layer 100 are shown in FIG. 1A. Here, the plug 104 is made from polysilicon. The polysilicon plug 104 is only partially formed because a layer of polysilicon material still covers the inter-metal dielectric layer 100 at the top of the plug 104. The layer of polysilicon material needs to be removed by planarization.

As shown in FIG. 1A, after polysilicon material is deposited into the opening 102 to form the polysilicon layer 104, the upper surface of the polysilicon layer 104 is rugged. Recesses 105 are normally formed in regions above the openings 102.

To remove the recesses 105 from the polysilicon layer 104, the polysilicon layer is planarized using a high-density plasma etching station. After an etching operation, a structure as shown in FIG. 1B is formed. As shown in FIG. 1B, recesses 105a are seen in the polysilicon layer 104a near the mouth of the openings 102. The central portion of these recesses 105a is at a level much lower than at the two corner regions. Moreover, the top surface of the polysilicon layer 104a formed by the aforementioned etching back step is at a level slightly below the top surface of the inter-metal dielectric layer 100. In other words, a portion of the polysilicon near the top of the polysilicon plug is permanently removed in addition to the recesses 105a at the top.

SUMMARY OF THE INVENTION

The invention provides a method of planarizing a polysilicon plug. An interconnect structure having a dielectric layer thereon is provided. The dielectric layer has an opening. Polysilicon is deposited into the opening such that the opening is overfilled. A recess is formed on the upper surface of the polysilicon layer above the opening. Planarization of the polysilicon plug is carried out by depositing a high molecular weight sacrificial film over the polysilicon layer such that the recess is entirely filled. The sacrificial film and the polysilicon layer are etched back to remove the sacrificial film and the polysilicon layer above the dielectric layer outside the opening. The polysilicon layer that remains inside the opening becomes a fully planarized polysilicon plug. The present invention thus provides a polysilicon plug with a flat top surface.

The high molecular weight sacrificial film is preferably deposited inside an inductive coupled plasma etcher that can produce high-density difluoromethane ($CH_2F_2$) plasma at a rate of about 10 to about 50 sccm.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
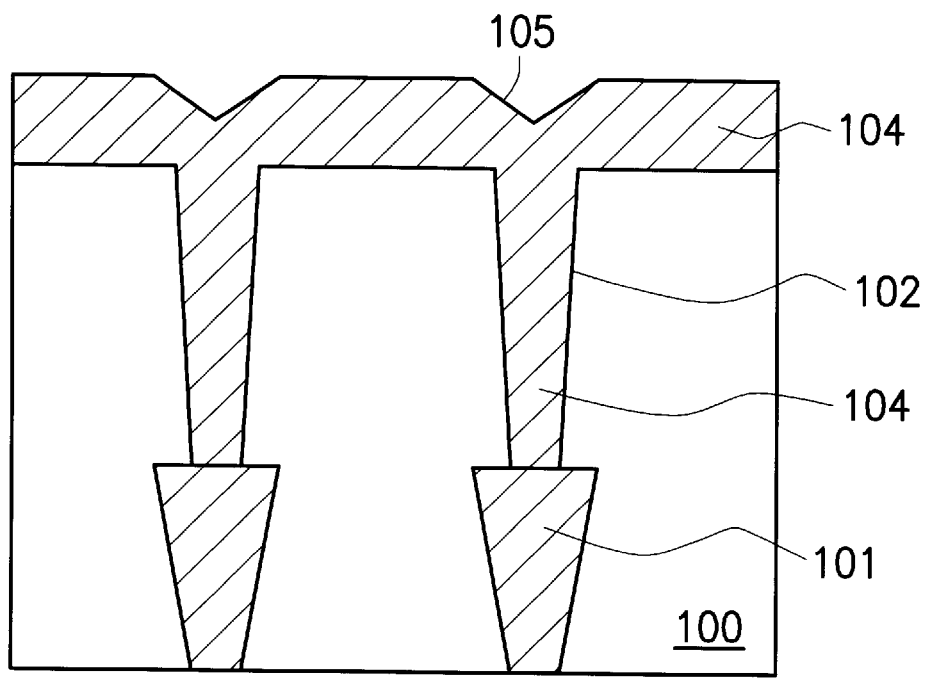
FIGS. 1A and 1B are schematic cross-sectional views showing the process of planarizing a conventional polysilicon plug.
Figure 1B:
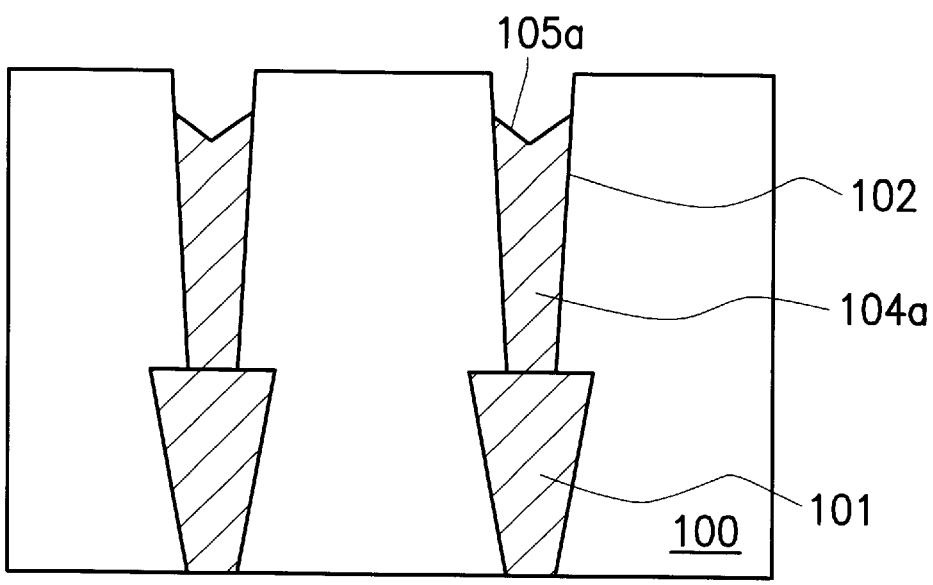

Reference will now be made in detail to the present preferred embodiments of the invention, examples of which are illustrated in the accompanying drawings. Wherever possible, the same reference numbers are used in the drawings and the description to refer to the same or like parts.

Figure 2A:
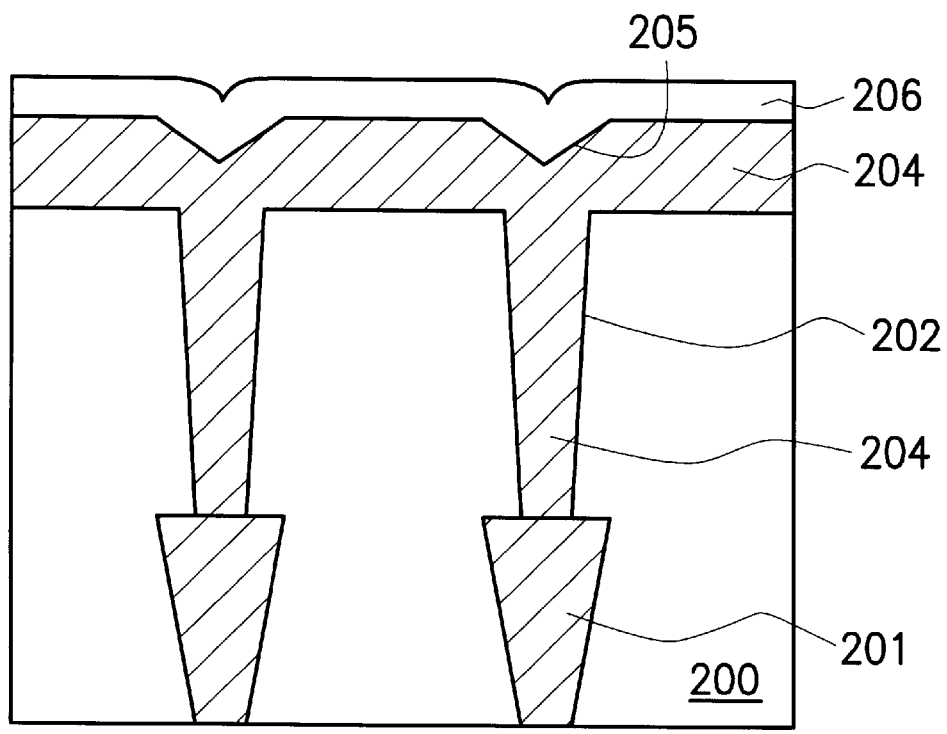
FIGS. 2A and 2B are schematic cross-sectional views showing the process of planarizing a polysilicon plug according to one preferred embodiment of the invention.
Figure 2B:
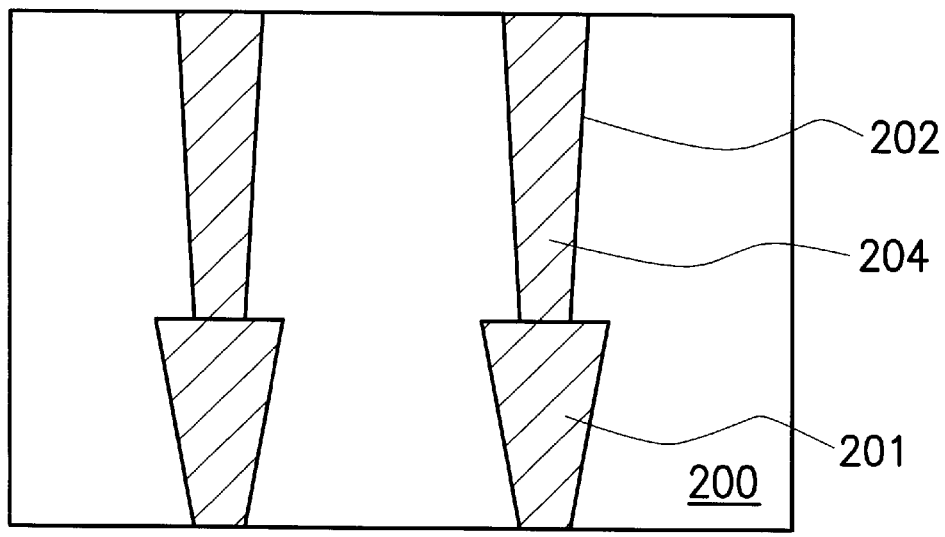

FIGS. 2A and 2B are schematic cross-sectional views showing the process of planarizing a polysilicon plug according to one preferred embodiment of this invention.

As shown in FIG. 2A, a dielectric layer 200 such as an inter-metal dielectric layer is provided. An opening 202 is formed in the dielectric layer 200. The opening 202 can be, for example, a via opening that exposes, for example, a portion of a first metal line 201 or a source/drain region 201. Polysilicon is deposited to form a polysilicon layer 204 such that the opening 202 is completely filled and the dielectric layer 200 is covered. A recess 205 is also formed on the top surface of the polysilicon layer 204 above the opening 202. A high molecular weight film 206 is deposited over the polysilicon layer 204 by performing a chemical vapor deposition. The film 206 completely fills the recess 205. Since the film 206 will be completely removed in a subsequent operation, it functions as a sacrificial layer.

The high molecular weight film 206 is preferably formed by chemical deposition using an etcher. The etcher can be an inductive coupled plasma (ICP) etcher, for example. The ICP etcher is capable of producing high-density difluoromethane ($CH_2F_2$) plasma by inductive coils.

Plasma etching is actually a process that involves an etching reaction and a polymerization reaction in parallel.

Therefore, by adjusting the conditions of reaction, high molecular weight compound can be deposited from the plasma. In this embodiment, the reaction inside the plasma etcher is preferably conducted at a flow rate of about 10 to about 50 sccm so that high-density difluoromethane plasma can be produced. Using the aforementioned ICP etcher, a film of sacrificial layer 206 with ideal step coverage is formed.

As shown in FIG. 2B, the high molecular weight film 206 and the polysilicon layer 204 are etched back by performing an anisotropic etching operation inside a high-density plasma etcher, for example. The high molecular weight film 206 and the polysilicon layer 204 above the inter-metal dielectric layer 200 are removed. The polysilicon layer 204 that remains inside the opening becomes a planarized polysilicon plug. No recesses are formed at the top surface of the inter-metal dielectric layer 200. In the subsequent step, a second metal line (not shown) or other conductive structures are formed over the dielectric layer 200. Since conventional processes are used, detailed description is omitted here.

In summary, one major advantage of the method of this invention is the capability of forming a polysilicon plug structure without any recess at its top surface. The technique hinges upon the formation of a high molecular weight film by a plasma etcher.

Although the method of forming a polysilicon plug is illustrated, plugs formed with other types of materials can also be planarized by the method. For example, the method is equally applicable for planarizing conductive plugs such as aluminum plugs or tungsten plugs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of planarizing a polysilicon plug, comprising the steps of:
   providing an interconnect structure, wherein the interconnect structure includes a dielectric layer with an opening overfilled with a polysilicon layer, wherein a top of the polysilicon layer has a recess above the opening;
   forming a high molecular weight sacrificial film over the polysilicon layer by chemical vapor deposition using an inductive coupled plasma etcher comprising a high-density difluoromethane plasma in a manner that etching and polymerization reactions occur simultaneously, so that the recess is completely filled; and
   etching the sacrificial film and the polysilicon layer to remove entirely the sacrificial film and the polysilicon layer above the dielectric layer so that the polysilicon layer remaining inside the opening becomes a planarized polysilicon plug.

2. The method of claim 1, wherein the deposition of the high molecular weight sacrificial film is carried out inside an etching station.

3. The method of claim 1, wherein the etcher has a gas flow rate of about 10 to about 50 sccm.

4. The method of claim 1, wherein the step of etching back the sacrificial layer and the polysilicon layer includes anisotropic dry etching.

5. A method of forming polysilicon plug, comprising the steps of:
   providing a dielectric layer with an opening;
   depositing a polysilicon layer over the dielectric layer so that the opening is completely filled and a top surface of the dielectric layer is covered with the polysilicon layer, wherein the top surface of the polysilicon layer has a recess above the opening;
   depositing a high molecular weight compound to form a high molecular weight film over the polysilicon layer, using an inductive coupled plasma etcher comprising a high-density difluoromethane plasma in a manner that etching and polymerization reactions occure simultaneously, wherein the film fills the recess completely; and
   performing an anisotropic etching of the high molecular weight film and the polysilicon layer to completely remove the film and the polysilicon layer above the dielectric layer so that the polysilicon layer remaining inside the opening becomes a planarized polysilicon plug.

6. The method of claim 5, wherein deposition of the high molecular weight sacrificial film is carried out inside an etching station.

7. The process of claim 5, wherein the etcher has a gas flow rate of about 10 to about 50 sccm.

8. The method of claim 5, wherein the step of depositing high molecular weight compound includes chemical vapor deposition.

9. A process for manufacturing a conductive plug, comprising the steps of:
   a dielectric layer having a via opening;
   depositing a conductive material to form a conductive layer that fills the via opening and covers the dielectric layer;
   depositing a high molecular weight compound using an inductive coupled plasma etcher comprising a high-density difluoromethane plasma in a manner that etching and polymerization reactions occur simultaneously over the conductive layer to form a high molecular weight sacrificial film over the conductive layer; and
   etching the sacrificial film and the conductive layer above the dielectric layer to remove the sacrificial film entirely and the conductive layer above the dielectric layer.

10. The process of claim 9, wherein the step of forming the high molecular weight sacrificial film includes chemical vapor deposition.

11. The process of claim 9, wherein the deposition of the high molecular weight sacrificial film is carried out inside an etching station.

12. The process of claim 9, wherein the inductive coupled plasma etcher is capable of producing high-density difluoromethane ($CH_2F_2$) plasma.

13. The process of claim 9, wherein the etcher has a gas flow rate of about 10 to about 50 sccm.

* * * * *